US011287460B2

(12) United States Patent
Kondo

(10) Patent No.: US 11,287,460 B2
(45) Date of Patent: Mar. 29, 2022

(54) METHODS AND APPARATUS FOR MANAGING A BATTERY SYSTEM

(71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 212 days.

(21) Appl. No.: 16/776,599

(22) Filed: Jan. 30, 2020

(65) Prior Publication Data

US 2021/0239748 A1 Aug. 5, 2021

(51) Int. Cl.
*G01R 31/08* (2020.01)
*H01M 10/42* (2006.01)
(Continued)

(52) U.S. Cl.
CPC ......... *G01R 31/088* (2013.01); *G01R 31/085* (2013.01); *G01R 31/3648* (2013.01);
(Continued)

(58) Field of Classification Search
CPC G01R 31/088; G01R 31/3648; G01R 31/085; G01R 31/3842; G01R 31/389; G01R 31/367; G01R 31/392; G01R 31/382; G01R 31/3835; G01R 31/374; G01R 31/396; G01R 31/3828; G01R 31/388; G01R 31/36; G01R 31/387; H01M 10/486; H01M 10/425; H01M 2010/4271; H01M 10/48; H01M 2220/20; H01M 10/44; H01M 10/0525; H01M 10/482; H01M 10/441; Y02T 10/70; Y02T 10/7072; Y02T 10/62; Y02T 90/14; Y02T 10/72; B60L 58/12; B60L 58/13; B60L 2240/547; B60L 2240/545; B60L 2240/549; B60L 58/16; B60L 3/12; H02J 7/0048; H02J 7/0047;
(Continued)

(56) References Cited

U.S. PATENT DOCUMENTS 10,502,791 B1\* 12/2019 Li .................. G01R 31/367
2008/0007439 A1\* 1/2008 Hirose .............. H03M 1/1071
341/120
(Continued)

FOREIGN PATENT DOCUMENTS

JP 2017219923 A \* 12/2017

OTHER PUBLICATIONS

J. Kim and B. H. Cho, "Application of wavelet transform-based discharging/charging voltage signal denoising for advanced data-driven SOC estimator," 2015 IEEE Applied Power Electronics Conference and Exposition (APEC), 2015, pp. 3013-3018 (Year: 2015).\*

*Primary Examiner* — Daniel R Miller
(74) *Attorney, Agent, or Firm* — Dickinson Wright PLLC

(57) ABSTRACT

Various embodiments of the present technology may provide methods and apparatus for managing a battery system. The apparatus may provide a power line to connect a battery to a signal converter and a fuel gauge circuit to measure a voltage of the power line, detect noise on the power line, and control operation of a sensor and/or the fuel gauge circuit in response to the detected noise.

19 Claims, 8 Drawing Sheets

(51) Int. Cl.
*H01M 10/48* (2006.01)
*G01R 31/36* (2020.01)
*G01R 31/389* (2019.01)
*G01R 31/3842* (2019.01)

(52) U.S. Cl.
CPC ....... *G01R 31/389* (2019.01); *G01R 31/3842* (2019.01); *H01M 10/425* (2013.01); *H01M 10/486* (2013.01); *H01M 2010/4271* (2013.01)

(58) Field of Classification Search
CPC .. H02J 7/007; H02J 7/0021; H02J 7/00; H02J 7/005; H02J 7/0029; H02J 7/0013; H02J 2310/48; B60W 2510/244
See application file for complete search history.

(56) References Cited

U.S. PATENT DOCUMENTS

| | | |
|---|---|---|
| 2017/0301587 A1 | 10/2017 | Yoshida |
| 2018/0041069 A1 | 2/2018 | Yu |
| 2018/0143252 A1* | 5/2018 | Kondo .................. H02J 7/007 |
| 2018/0145698 A1* | 5/2018 | Paone ................. H03M 1/0845 |
| 2018/0375135 A1 | 12/2018 | Kumada |

* cited by examiner

METHODS AND APPARATUS FOR MANAGING A BATTERY SYSTEM

BACKGROUND OF THE TECHNOLOGY

Battery-powered systems may include sensors, such as a thermistor, current sensor, and the like, that monitor various conditions of the battery. In turn, the information from the sensors may be used to estimate additional conditions of the battery, such as the state of health of the battery, state of charge of the battery, state of function of the battery, and the like. Therefore, accurate sensor information is needed to accurately estimate the additional conditions.

The sensor may generate an analog voltage signal and is typically connected to a signal converter that converts the analog voltage to a digital value. The signal converter responsible for performing the conversion may be biased with a supply voltage supplied by the battery through a power line. Fluctuations in the supply voltage on the power line may adversely affect the operation of the signal converter, and thus the accuracy of the digital value.

SUMMARY OF THE INVENTION

Various embodiments of the present technology may provide methods and apparatus for managing a battery system. The apparatus may provide a power line to connect a battery to a signal converter and a fuel gauge circuit to measure a voltage of the power line, detect noise on the power line, and control operation of a sensor and/or the fuel gauge circuit in response to the detected noise.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, timers, memory devices, signal converters, semiconductor devices, such as transistors and capacitors, and the like, which may carry out a variety of functions.

Figure 1:
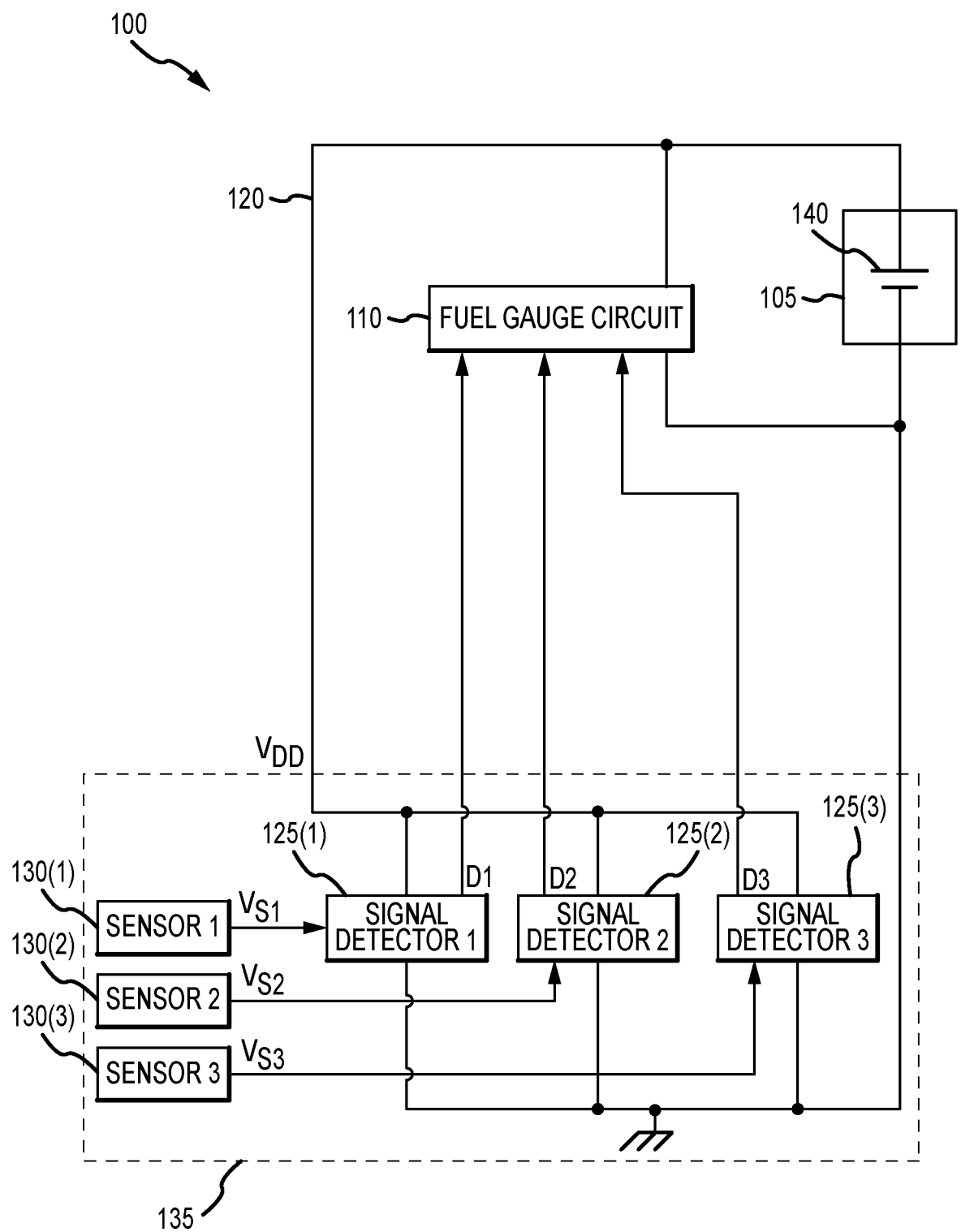
FIG. 1 is a block diagram of a system in accordance with an exemplary embodiment of the present technology.
Figure 2:
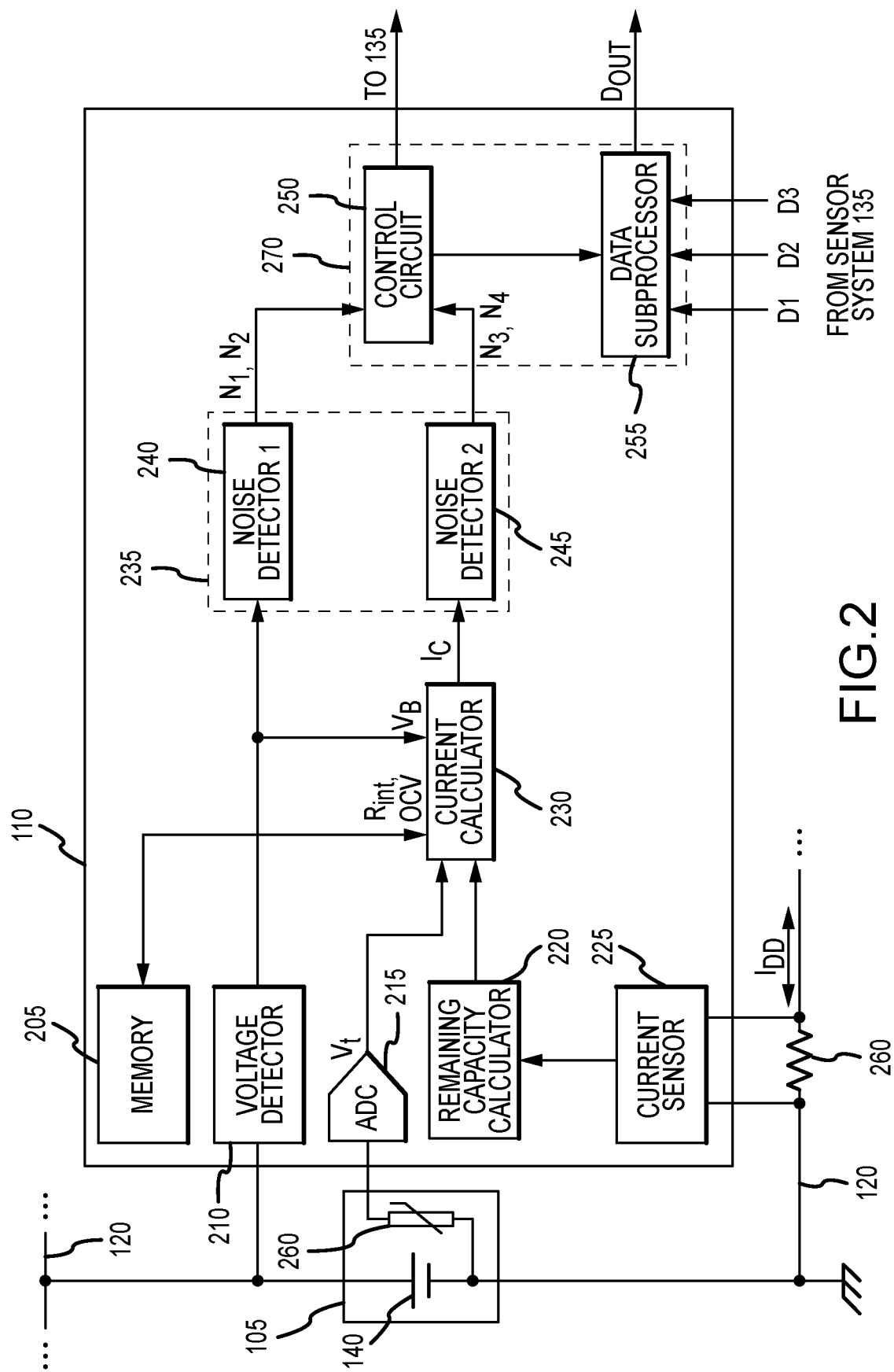
FIG. 2 is a block diagram of fuel gauge circuit in accordance with an exemplary embodiment of the present technology.

Methods and apparatus for managing a battery system according to various aspects of the present technology may operate in conjunction with any suitable battery-powered electronic system and/or device, such as "smart devices," wearables, consumer electronics, portable devices, medical devices, gaming systems, and the like. Referring to FIGS. 1 and 2, an exemplary system 100 may be integrated in an electronic device (not shown), such as smart watch or wireless headphones, powered by a rechargeable battery 140, such as a lithium ion battery. The system 100 may comprise a battery pack 105, a fuel gauge circuit 110, and a sensor system 135. The battery pack 105 may comprise the battery 140 and a temperature sensor 260, such as a thermistor. In an exemplary embodiment, the system 100 may further comprise a power line 120 connected to the battery 140 and configured to supply a supply voltage $V_{DD}$ to the sensor system 135.

The sensor system 135 may comprise one or more sensors 130, such as a first sensor 130(1), a second sensor 130(2), and a third sensor 130(3), and one or more corresponding signal detectors 125, such as a first signal detector 125(1) connected to the first sensor 130(1), a second signal detector 125(2) connected to the second sensor 130(2), and a third signal detector 125(3) connected to the third sensor 130(3). The sensor 130 may comprise any sensor type and may be selected according to the particular application. For example, the sensor 130 may comprise a current sensor to detect a current, a thermistor to detect a temperature, a passive infrared (PIR) sensor, and the like.

Each signal detector 125 may receive an analog voltage signal from the respective sensor 130, convert the analog voltage signal $V_S$ into a digital signal D, and transmit the digital signal to the fuel gauge circuit 110. For example, the first signal detector 125(1) may generate a first digital signal $D_1$ corresponding to a first analog voltage signal $V_{S1}$ from the first sensor 130(1), the second signal detector 125(2) may generate a second digital signal $D_2$ corresponding to a second analog voltage $V_{S2}$ from the second sensor 130(2), and the third signal detector may generate a third digital signal $D_3$ corresponding to a third analog voltage signal $V_{S3}$ from the third sensor 130(3).

The power line 120 may comprise any wire or connector suitable for delivering power from the battery 140 to the sensor system 135. In an exemplary embodiment, the power line 120 biases each of the signal detectors 125(1)~125(3) with the supply voltage $V_{DD}$. Accurate detection and conversion of the analog voltage $V_S$ depends on a stable supply voltage $V_{DD}$ (i.e., a supply voltage that does not fluctuate). However, internal characteristics of the battery 140, such as an internal resistance, can cause fluctuations in the supply voltage $V_{DD}$, which may influence the operation of the signal detector 125, and thus the accuracy of the digital signal D.

The fuel gauge circuit 110 may be configured to manage various battery operations and monitor various battery conditions. For example, the fuel gauge circuit 110 may be configured to measure a voltage $V_B$ of the battery 140, measure a current $I_{DD}$ of the battery 140, compute a remaining capacity (also expressed as a percentage and referred to as the relative state of charge RSOC or state of charge (SOC)) of the battery 140. For example, the fuel gauge circuit 110 may comprise a voltage detector 210, a remaining capacity calculator 220, and a current sensor 225. In various embodiments, the fuel gauge circuit 110 may be further configured to estimate various battery conditions, such as a state of health (SOH) of the battery 140, a state of function (SOF) of the battery 140, and the like.

In an exemplary embodiment, the fuel gauge circuit 110 may be further configured to detect noise on the power line 120. For example, the fuel gauge circuit 110 may comprise a noise detection circuit 235 configured to detect noise by detecting fluctuations in the voltage on the power line 120 and/or detecting fluctuations in the current on the power line 120. The noise detection circuit 235 may generate one or more noise indicator signals that indicate a level of noise detected on the power line 120.

The fuel gauge circuit 110 may be further configured to receive and process data from the sensor system 135 and/or control various operations of the system 100 and/or sensor system 135. For example, the fuel gauge circuit 110 may comprise a data processor 270 connected to an output terminal of the noise detection circuit 235 and one or more terminals of the sensor system 135.

In an exemplary embodiment, the data processor 270 may receive a number of digital signals (e.g., digital signals from the first signal detector 125(1)), perform sampling on the signals, and compute an average of the sampled signals and/or other desired computations using the sampled signals. For example, the data processor 270 may comprise a data sub-processor 255 that receives the digital output signals (e.g., $D_1$~$D_3$) and generates a data output signal $D_{OUT}$ based on the sampled digital signals. The data sub-processor 155 may comprise sampling circuitry (not shown) to sample the digital output signals and compute an average of the sampled signals. The computed average may be represented by the data output signal $D_{OUT}$. The data sub-processor 155 may transmit the data output signal $D_{OUT}$ to an application processor (not shown) configured to compute battery characteristics, such as the state of health (SOH) of the battery 140, and the state of function (SOF) of the battery 140, according to the data output signal $D_{OUT}$.

The fuel gauge circuit 110 may be further configured to control various operations of the system 100 and/or the sensor system 135. For example, the data processor 270 may comprise a control circuit 250 that controls operation of the sensor system 135 according to the noise indicator signals received from the noise detection circuit 235. The control circuit 250 may also control operations, such as sampling rate, and/or the number of computations performed by the data sub-processor 255 according to the noise indicator signals received from the noise detection circuit 235.

In an exemplary embodiment, the fuel gauge circuit 110 may comprise a voltage detector 210 to measure a voltage of the battery 140 (which is also the voltage of the power line 120). The voltage detector 210 may comprise a voltage sensor (not shown) that operates in conjunction with an analog-to-digital converter (not shown) and/or sampling circuitry (not shown). The voltage detector 210 may generate digital voltage signals $V_B$ based on the measured voltage. The voltage detector 210 may be connected to the power line 120 and the battery 140, and may comprise any circuit and/or device suitable for measuring a voltage potential.

The current sensor 225 may measure a current on the power line 120 by direct connection to the power line 120. The current sensor 135 may comprise any circuit and/or device suitable for measuring current. For example, the current sensor 225 may operate in conjunction with a sense resistor 260 integrated in the power line 120, wherein the current senor 225 measures a change in voltage across the sense resistor 260 to determine the current.

The remaining capacity calculator 220 may be configured to compute the remaining capacity of the battery 140 according to a detected current. The remaining capacity (measured in ampere-hours) may be represented as the state of charge (SOC) of the battery (where the SOC is represented as a percentage). The capacity calculation circuit 125 may be connected to the current sensor 225 and may receive current information from the current sensor 225. The capacity calculation circuit 125 may determine the remaining capacity according to an accumulated current over a period of time. The remaining capacity calculator 220 may comprise any circuit and/or system suitable for computing the remaining capacity of the battery 140 according to conventional "coulomb counting" methods and techniques.

The fuel gauge circuit 110 may further comprise a signal converter, such as an analog-to-digital converter (ADC) 215 to convert an analog signal to a digital signal. In an exemplary embodiment, the ADC 215 may be configured to receive an analog signal from the temperature sensor 260 and convert the analog signal to a digital voltage signal Vt, wherein the digital voltage signal Vt corresponds to a temperature of the battery 140.

According to an exemplary embodiment, the fuel gauge circuit 110 may further comprise a memory 205 to store relevant battery data. For example, the memory 205 may store various predetermined threshold values, such as a first voltage threshold $V_{TH1}$, a second voltage threshold $V_{TH2}$, a first current threshold $I_{TH1}$, and a second current threshold $I_{TH2}$. The value of the thresholds described above may be set based on the particular system application and/or acceptable levels of fluctuations in the voltage and current.

Figure 4:
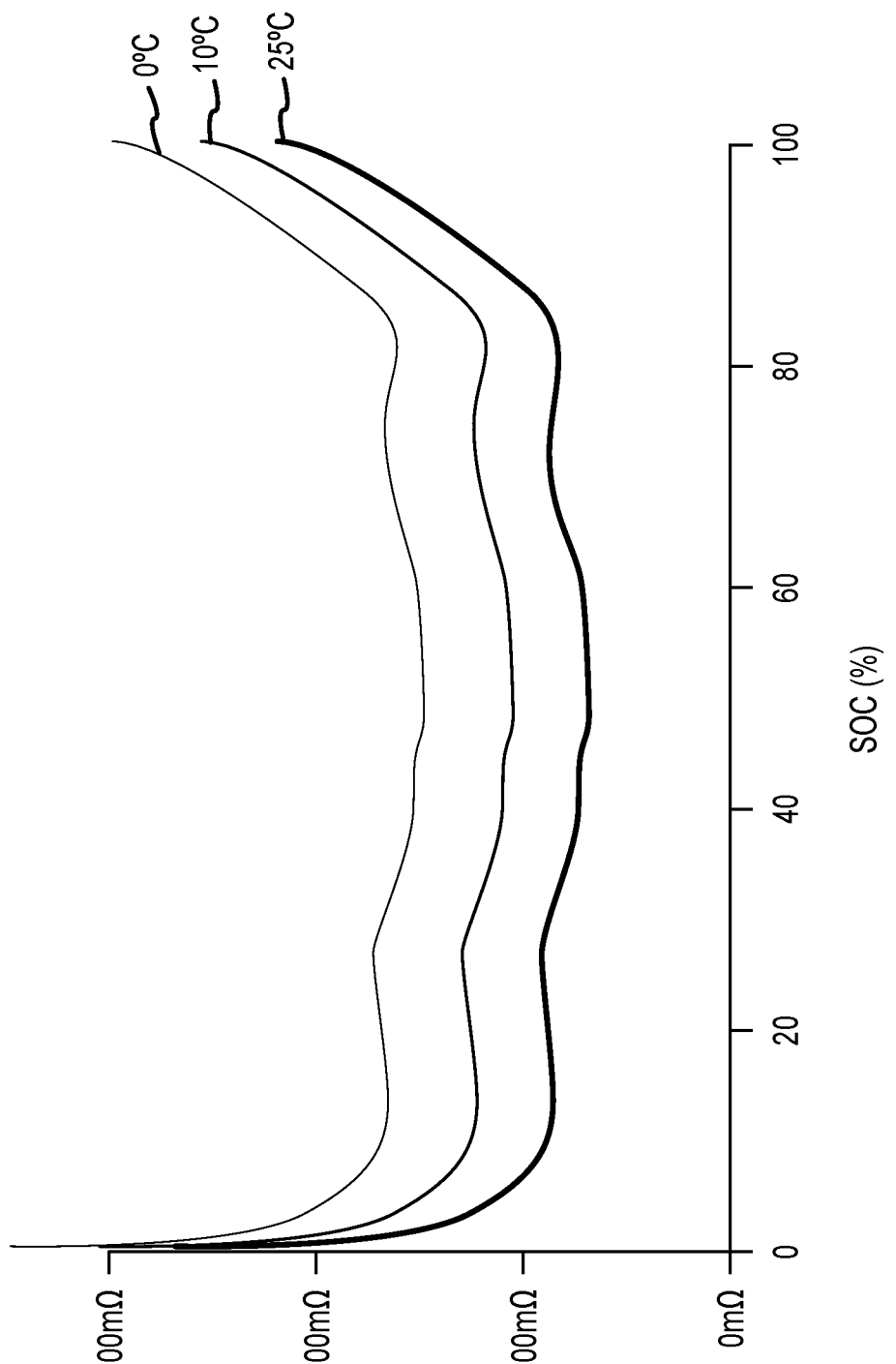
FIG. 4 is a chart illustrating internal resistance value as a function of SOC and temperature in accordance with an exemplary embodiment of the present technology.
Figure 5:
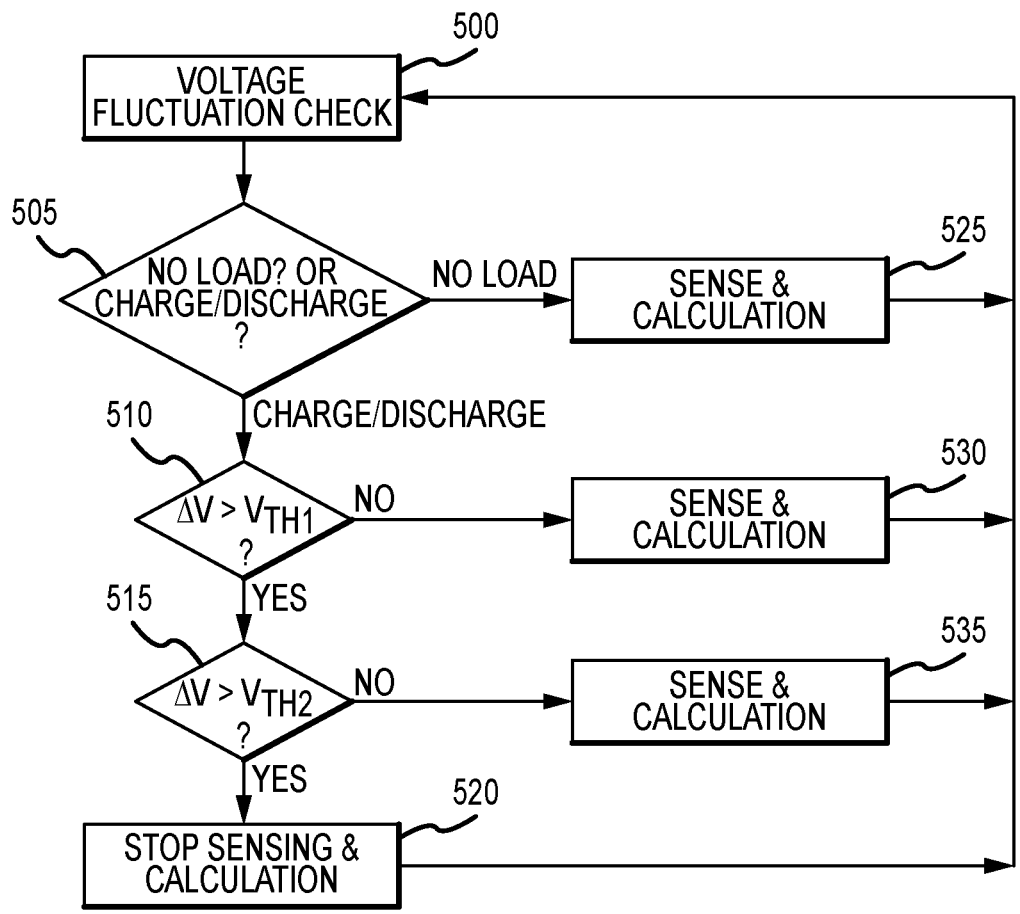
FIG. 5 is a flow chart for detecting noise by monitoring voltage fluctuations and operating the system in accordance with an exemplary embodiment of the present technology.
Figure 6:
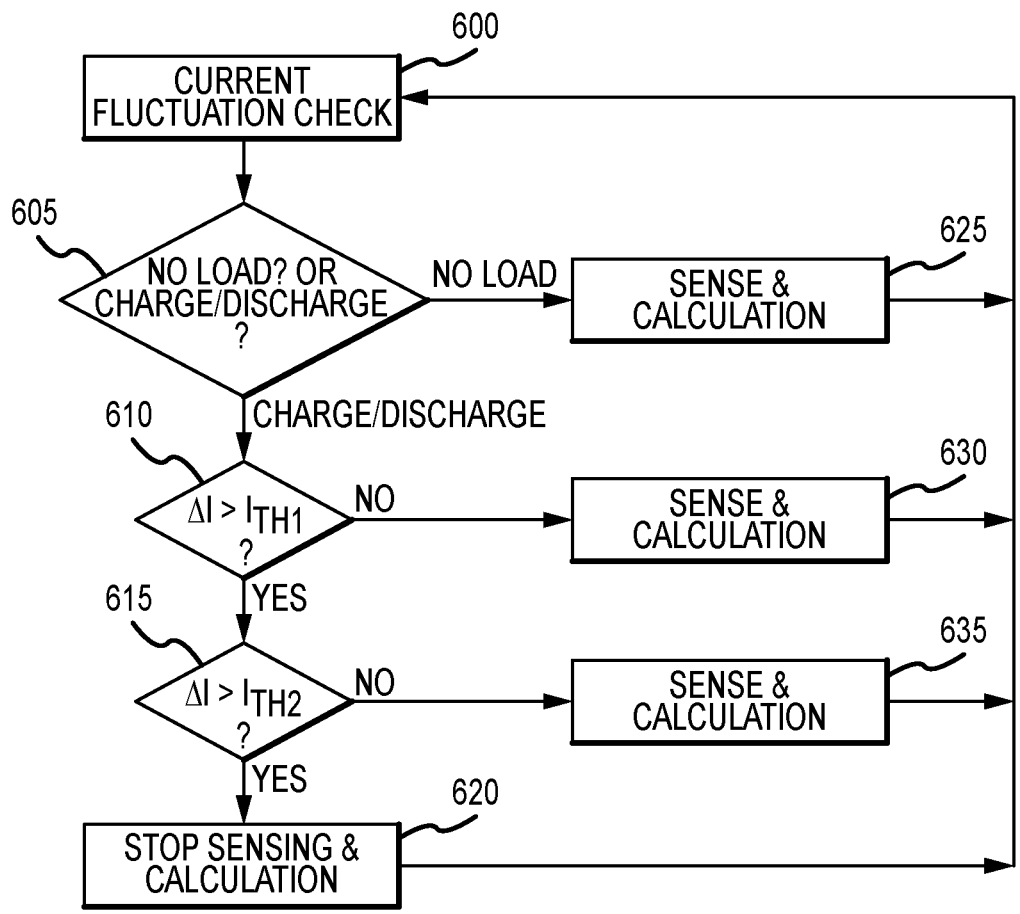
FIG. 6 is a flow chart for detecting noise by monitoring current fluctuations and operating the system in accordance with an exemplary embodiment of the present technology.
Figure 7:
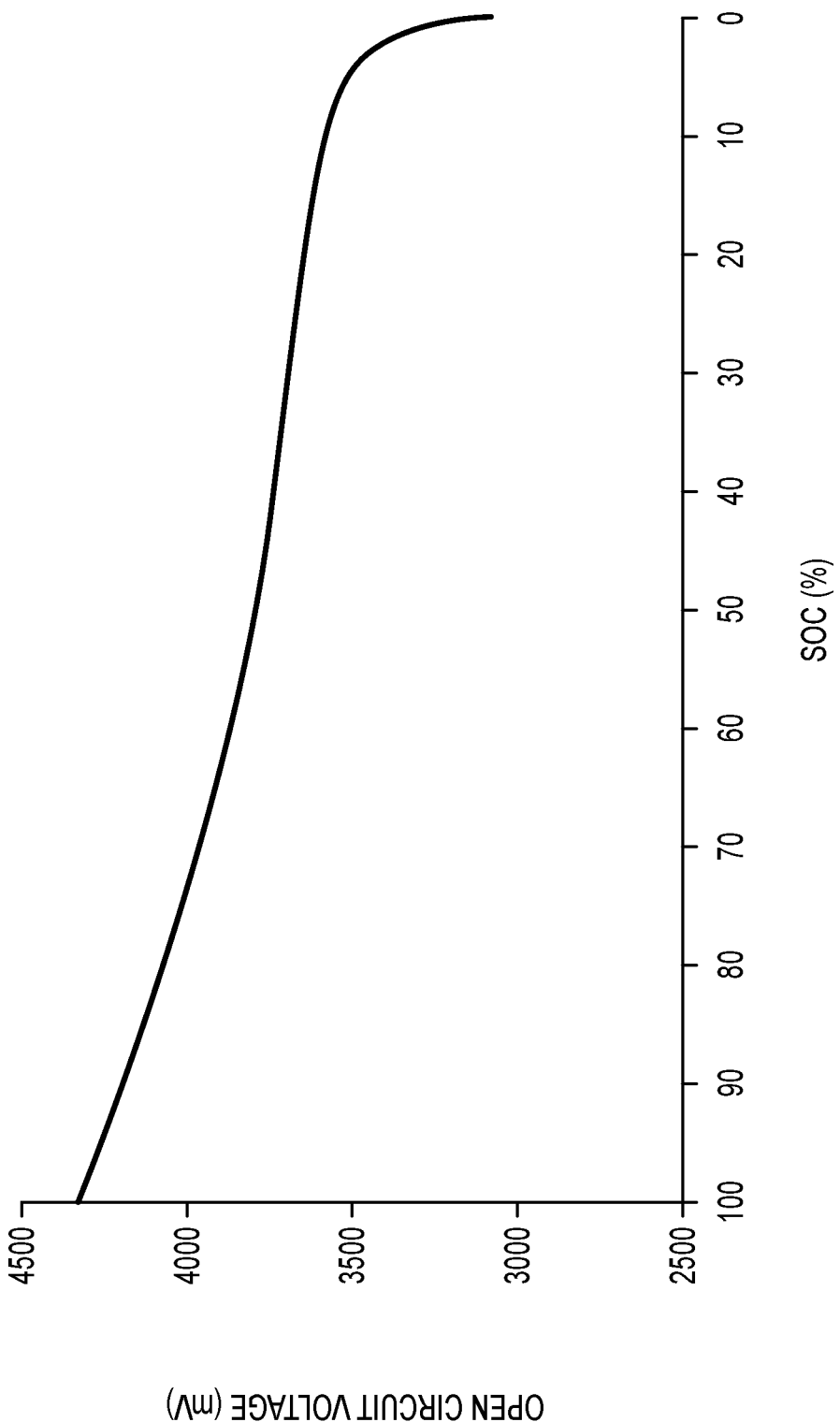
FIG. 7 is a chart illustrating open circuit voltage values as a function of SOC in accordance with an exemplary embodiment of the present technology.
Figure 8:
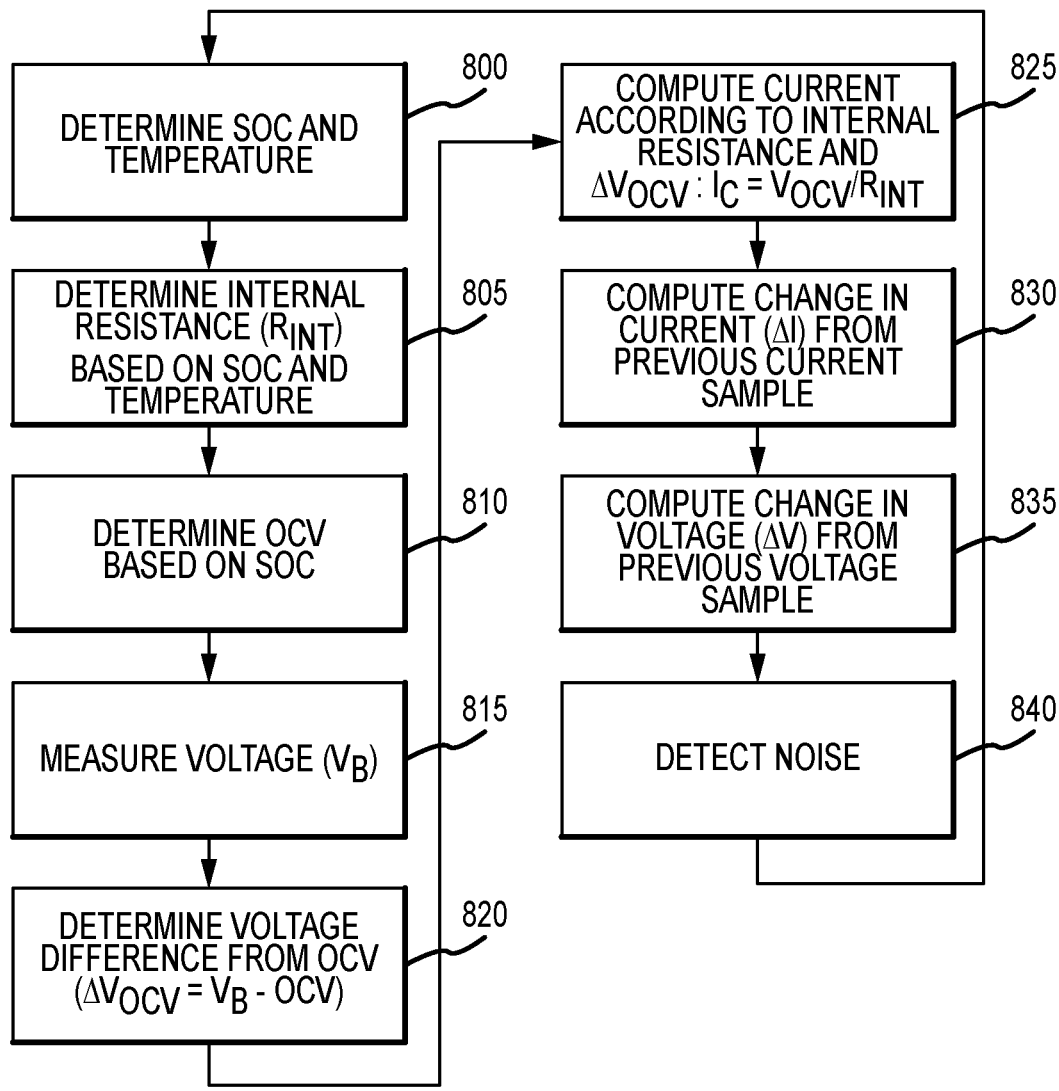
FIG. 8 is a flow chart for operating the system in accordance with an exemplary embodiment of the present technology.

The memory 205 may also store relational data, such as internal resistance $R_{INT}$ values as a function of SOC and temperature (e.g., as illustrated in FIG. 4). Such relational data may be stored in a look-up table or other suitable format. The memory may also be configured to store known battery characteristic values, such as open circuit voltage values as a function of the SOC (e.g., as illustrated in FIG. 7). The memory 205 may comprise any number or type of storage devices, such as registers, ROM (read only memory), RAM (random access memory), and the like.

The current calculator 230 may compute a current $I_C$ based on an internal resistance $R_{INT}$ of the battery 140 and a change in voltage relative to an open circuit voltage (OCV). The internal resistance $R_{INT}$ of the battery 140 may be determined based on the SOC of the battery 140 and a temperature of the battery 140. In an exemplary embodiment, the current calculator 230 may be configured to receive or otherwise retrieve the SOC from the remaining capacity calculator 220 and the digital voltage signal Vt. The current calculator 230 may convert the digital voltage signal Vt into a corresponding temperature, measured in degrees Celsius. The current calculator 230 may then retrieve an internal resistance $R_{INT}$ from the memory 205 based on the SOC and the temperature. For example, if the current calculator 230 receives a 40% SOC value and a temperature of 10 degrees Celsius, then the current calculator 230 may retrieve an internal resistance value of 250 mΩ.

The current calculator 230 may also determine the change in voltage relative to an open circuit voltage. For example, the current calculator 230 may receive the measured voltage $V_B$ from the voltage detector 210 and an open circuit voltage value from the memory 205, and compute the voltage change from the open circuit voltage.

The current calculator 230 may then use the internal resistance value $R_{INT}$ and the change in voltage relative to the OCV ($\Delta V_{OCV}$) to compute the current $I_C$ according to the following: $I_C = \Delta V_{OCV}/R_{INT}$. The current calculator 230 may transmit the computed current $I_C$ to the noise detection circuit 235.

The current calculator 230 may comprise any number of circuits and/or systems suitable for performing various functions and computations, as described above. For example, the current calculator 230 may comprise storage devices (e.g., a register), a series of logic gates, a field programmable gate array, an application specific integrated circuit, and the like.

The noise detection circuit 235 may be configured to detect noise on the power line 120. In an exemplary embodiment, the noise detection circuit 235 may detect noise on the power line 120 by monitoring voltage fluctuations on the power line 120 and monitoring current fluctuations on the power line 120. For example, the noise detection circuit 235 may comprise a first noise detector 240 to detect voltage fluctuations and a second noise detector 245 to detect current fluctuations.

Figure 3:
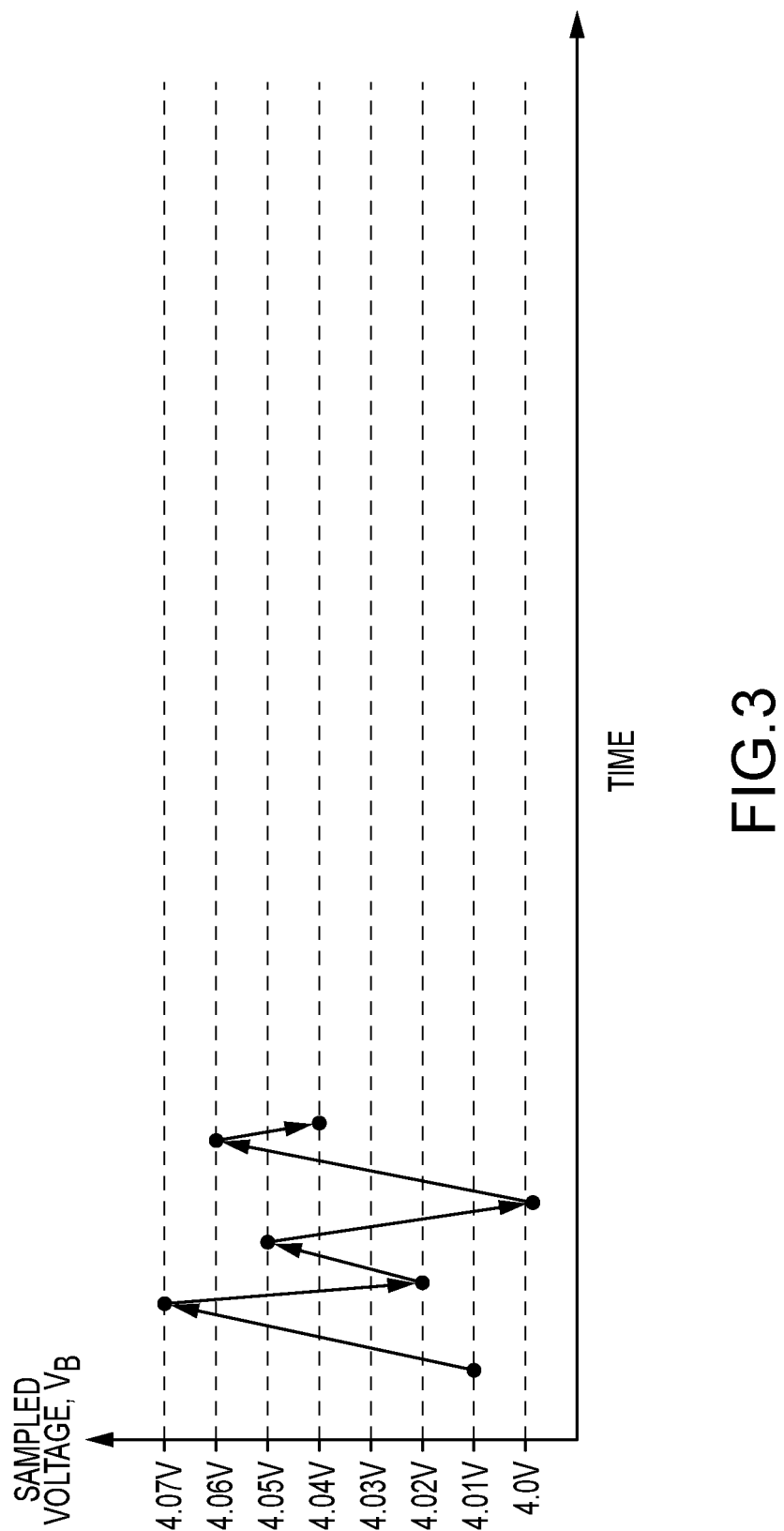
FIG. 3 is example voltage data samples in accordance with an exemplary embodiment of the present technology.

The first noise detector 240 may receive voltage data (e.g., sampled voltage signals $V_B$) from the voltage detector 210 and compute a change in voltage ($\Delta V$) between each sampled value. For example, and referring to FIG. 3, the first noise detector 240 may receive a first voltage of 4.01V and a second sample of 4.07V and compute a change in voltage from the first sample to the second sample—in this case, the change in voltage is 0.06V. The first noise detector 240 may then receive a third voltage of 4.02V and compute a change in voltage from the second sample to the third sample—in this case, the change in voltage is −0.05V. The first noise detector 240 may continue to compute the change in voltage for each successive sample. The first noise detector 240 may comprise any circuit and/or system suitable for computing a difference between two values, such as a subtractor, a series of logic gates, and the like.

The first noise detector 240 may be further configured to compare the computed change in voltage to one or more voltage threshold values. In an exemplary embodiment, the first noise detector 240 may compare the change in voltage to the first voltage threshold $V_{TH1}$ and the second voltage threshold $V_{TH2}$. For example, the first noise detector 240 may comprise a first comparator (not shown) to compare the change in voltage to the first voltage threshold $V_{TH1}$ and a second comparator (not shown) to compare the change in voltage to the second voltage threshold $V_{TH2}$. The first noise detector 240 may receive or otherwise retrieve the first and second voltage threshold values $V_{TH1}$, $V_{TH2}$ from the memory 205. Alternatively, the first noise detector 240 may comprise a set of registers to store the first and second voltage threshold values $V_{TH1}$, $V_{TH2}$.

The first noise detector 240 may generate a first noise signal $N_1$ in response to comparing the change in voltage to the first voltage threshold $V_{TH1}$, and may further generate a second noise signal $N_2$ in response to comparing the change in voltage to the second voltage threshold $V_{TH2}$. The first and second noise signals $N_1$, $N_2$ may indicate a level of noise detected on the power line 120. The first noise detector 240 may transmit the first and second noise signals $N_1$, $N_2$ to the control circuit 250 for further analysis.

The second noise detector 245 may receive current data (e.g., computed current $I_C$) from the current calculator 230 and compute a change in current ($\Delta I$) between each consecutive value. For example, the second noise detector 245 may receive a first current of 1.1 A and a second current of 1.2 A and compute a change in current from the first sample to the second sample—in this case, the change in current is 0.1 A. The second noise detector 245 may then receive a third current of 1.3 A and compute a change in current from the second sample to the third sample—in this case, the change in current is 0.1 A. The second noise detector 245 may continue to compute the change in current for each successive sample. The second noise detector 245 may comprise any circuit and/or system suitable for computing a difference between two values, such as a subtractor, a series of logic gates, and the like.

The second noise detector 245 may be further configured to compare the computed change in current to one or more current threshold values. In an exemplary embodiment, the second noise detector 245 may compare the change in current to the first current threshold $I_{TH1}$ and the second current threshold $I_{TH2}$. For example, the second noise detector 245 may comprise a third comparator (not shown) to compare the change in current to the first current threshold $I_{TH1}$ and a fourth comparator (not shown) to compare the change in current to the second current threshold $I_{TH2}$. The second noise detector 245 may receive or otherwise retrieve the first and second current threshold values $I_{TH1}$, $I_{TH2}$ from the memory 205. Alternatively, the second noise detector 245 may comprise a set of registers to store the first and second current threshold values $I_{TH1}$, $I_{TH2}$.

The second noise detector 245 may generate a third noise signal $N_3$ in response to comparing the change in current to the first current threshold $I_{TH1}$, and may further generate a fourth noise signal $N_4$ in response to comparing the change in current to the second current threshold $I_{TH2}$. The third and fourth noise signals $N_3$, $N_4$ may indicate a level of noise detected on the power line 120. The second noise detector 245 may transmit the third and fourth noise signals $N_3$, $N_4$ to the control circuit 250 for further analysis.

In operation, and referring to FIGS. 1-3 and 4-8, the fuel gauge circuit 110 may determine the SOC of the battery 140 (for example, using the remaining capacity calculator) and determine the temperature of the battery 140 (for example, using the temperature sensor 260 in conjunction with the ADC 215 and the current calculator 230) (800). The fuel gauge circuit 110 may determine the internal resistance RINT of the battery 140 using the determined SOC and temperature (for example, the current calculator 230 may retrieve the internal resistance value $R_{INT}$ from the memory 205 based on the SOC and temperature) (805). The fuel gauge circuit 110 may determine the OCV based on the determined SOC (for example, the current calculator 230 may retrieve the OCV value corresponding to the determined SOC from the memory 205) (810). The fuel gauge circuit 110 may measure the voltage on the power line 120 (for example, using the voltage detector 210) (815). The fuel gauge circuit 110 may determine the voltage difference from the OCV ($\Delta V_{OCV}$) (820). The fuel gauge circuit 110 may compute the current $I_C$ according to the internal resistance and voltage difference from the OCV (for example, using the current calculator 230). The fuel gauge circuit 110 may compute a change current between a currently-computed current and a previously-computed current (for example, using the second noise detector 245, wherein the second noise detector 245 receives a sequence of computed currents from the current calculator 230) (830). The fuel gauge circuit 110 may compute a change in voltage between a currently-compute voltage and a previously-computed voltage (for example, using the first noise detector 240, wherein the first noise detector 240 receives a sequence of measured voltages from the voltage detector 210) (835). The fuel gauge circuit 110 may detect noise on the power line 120 by monitoring fluctuations in the voltage and/or the current (840).

In an exemplary embodiment, monitoring fluctuations in the voltage may comprise initiating a voltage fluctuation check (500) and determining if the battery 140 is in a "no-load" condition or if the battery 140 is charging/discharging (505) (for example, using the first noise detector 240). If the battery 140 is in the "no-load" condition, then the fuel gauge circuit 110 may generate an operation signal and transmit the operation signal to the sensor system 135, wherein the operation signal directs the sensor system 135 to continue normal operations and sensing functions (525).

If the battery 140 is charging/discharging, then the first noise detector 240 may determine whether the change in voltage is greater than the first voltage threshold $V_{TH1}$ (510). If the change in voltage is not greater than the first voltage threshold $V_{TH1}$, this may indicate that little-to-no noise (i.e., low-level noise) exists on the power line 120 and the first noise detector 240 may generate the operation signal and transmit the operation signal to the control circuit 250 (530). The control circuit 250 may respond to the operation signal by adjusting the sampling rate of the incoming sensor data (e.g., $D_1$~$D_3$) via the data sub-processor 255.

If the change in voltage is greater than the first voltage threshold $V_{TH1}$, this suggests that some noise may be present on the power line 120. The first noise detector 240 may determine whether the change in voltage is greater than the second voltage threshold $V_{TH2}$ (515). If the change in voltage is not greater than the second voltage threshold $V_{TH2}$ (but greater than the first voltage threshold $V_{TH1}$), this may indicate that some noise (i.e., mid-level noise) exists on the power line 120 and the first noise detector 240 may report the noise by generating the first noise signal $N_1$ and transmitting the first noise signal $N_1$ to the control circuit 250. The control circuit 250 may respond to the first noise signal $N_1$ by adjusting the sampling rate of the incoming sensor data (e.g., $D_1$~$D_3$) via the data sub-processor 255 (535). For example, the data sub-processor 255 may increase the sampling rate and use more data samples to compute the sample average.

If the change in voltage is greater than the second voltage threshold $V_{TH2}$, this suggests that an unacceptable amount of noise (i.e., high-level noise) is present on the power line 120 and the first noise detector 240 may report the noise by generating the second noise signal $N_2$ and transmitting the second noise signal $N_2$ to the control circuit 250. The control circuit 250 may respond to the second noise signal $N_2$ by halting operation of the sensor system 135 and/or prevent sensor data from being processed in the data sub-processor 255. The data sub-processor 255 may respond to signals from the control circuit 250 by preventing use or otherwise ignoring incoming sensor data (e.g., $D_1$~$D_3$) (520).

In an exemplary embodiment, monitoring fluctuations in the current may comprise initiating a current fluctuation check (600) and determining if the battery 140 is in a "no-load" condition or if the battery 140 is charging/discharging (605) (for example, using the first noise detector 240). If the battery 140 is in the "no-load" condition, then the fuel gauge circuit 110 may generate an operation signal and transmit the operation signal to the sensor system 135, wherein the operation signal directs the sensor system 135 to continue normal operations and sensing functions (625).

If the battery 140 is charging/discharging, then the second noise detector 245 may determine whether the change in current is greater than the first current threshold $I_{TH1}$ (610). If the change in current is not greater than the first current threshold $I_{TH1}$, this may indicate that little-to-no noise (i.e., low-level noise) exists on the power line 120 and the second noise detector 245 may generate the operation signal and transmit the operation signal to the control circuit 250. The control circuit 250 may respond to the operation signal by adjusting the sampling rate of the incoming sensor data (e.g., $D_1$~$D_3$) via the data sub-processor 255 (630).

If the change in current is greater than the first current threshold $I_{TH1}$, this suggests that some noise may be present on the power line 120. The second noise detector 245 may determine whether the change in current is greater than the second current threshold $I_{TH2}$ (615). If the change in current is not greater than the second current threshold $I_{TH2}$ (but greater than the first current threshold $I_{TH1}$), this may indicate that some noise (i.e., mid-level noise) exists on the power line 120 and the second noise detector 245 may report the noise by generating the third noise signal $N_3$ and transmitting the third noise signal $N_3$ to the control circuit 250. The control circuit 250 may respond to the third noise signal $N_3$ by adjusting the sampling rate of the incoming sensor data (e.g., $D_1$~$D_3$) via the data sub-processor 255 (635). For example, the data sub-processor 255 may increase the sampling rate and use more data samples to compute the sample average.

If the change in current is greater than the second current threshold $I_{TH2}$, this suggests that an unacceptable amount of noise (i.e., high-level noise) is present on the power line 120 and the second noise detector 245 may report the noise by generating the fourth noise signal $N_4$ and transmitting the fourth noise signal $N_4$ to the control circuit 250. The control circuit 250 may respond to the fourth noise signal $N_4$ by halting operation of the sensor system 135 and/or prevent sensor data from being processed in the data sub-processor 255. The data sub-processor 255 may respond to signals from the control circuit 250 by preventing use or otherwise ignoring incoming sensor data (e.g., $D_1$~$D_3$) (620).

In various embodiments, the fuel gauge circuit 110 may monitor voltage fluctuations and current fluctuations simultaneously. In such a case, the control circuit 250 may receive noise signals (e.g., $N_1$, $N_2$, $N_3$, $N_4$) from the first and second noise detectors 240, 245 at the same time and may determine whether an unacceptable amount of noise exists on the power line 120 based on a combination of the noise signals. For example, the control circuit 250 may halt operation of the sensor system 135 and/or the data sub-processor 255 only if the control circuit 250 receives both the second noise signal $N_2$ (indicating unacceptable noise by way of voltage fluctuations) and the fourth noise signal $N_4$ (indicating unacceptable noise by way of current fluctuations). In addition, in such a case where operations of the sensor system 135 and/or data sub-processor 255 are halted due to unacceptable noise by voltage and/or current fluctuations on the power line 120, the fuel gauge circuit 110 may also be unable to compute battery characteristics, such as the SOH, SOF, and the like, since the data used to compute these may be unavailable.

In other embodiments, the fuel gauge circuit 110 may monitor only voltage fluctuations or only current fluctuations at a given time. In such a case, the control circuit 250 may operate according to the noise signals from only the first noise detector 240 or the second noise detector 245 at the given time.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus capable of connecting to a battery and a signal converter, wherein the battery and signal converter are connected with a power line and the signal converter generates data according to a sensor, comprising:
   a fuel gauge circuit configured to connect to the power line and receive data from the signal converter, wherein the fuel gauge circuit comprises:
      a memory configured to store a first voltage threshold and a second voltage threshold;
      a voltage sensor configured to measure a voltage of the power line;
      a noise detection circuit in communication with the memory and the voltage sensor, wherein the noise detection circuit is configured to:
         compute a change in voltage based on the measured voltage;
         determine a level of noise on the power line based on the computed change in voltage;
         compare the change in voltage to the first voltage threshold value; and
         compare the change in voltage to the second voltage threshold value, wherein the second threshold value is greater than the first threshold value; and
      a data processor responsive to the noise detection circuit and configured to:
         process the data based on the level of noise on the power line; and
         control at least one of: operation of the sensor and the data, based on the level of noise on the power line,
         wherein, to process the data based on the level of noise on the power line, the data processor is further configured to adjust a sampling rate of the received data based on the comparisons of the change in voltage to the first voltage threshold and the second voltage threshold.

2. The apparatus according to claim 1, wherein processing the data comprises averaging all the received data if the change in voltage is less than the first threshold value.

3. The apparatus according to claim 1, wherein processing the data comprises averaging only a portion of the received data if:
   the change in voltage is greater than the first threshold value; and
   the change in voltage is less than the second threshold value.

4. The apparatus according to claim 1, wherein processing the data comprises rejecting the received data if the change in voltage is greater than the second threshold value.

5. The apparatus according to claim 1, wherein the data processor is further configured to transmit a control signal to the sensor if the change in voltage is greater than the second threshold value; wherein the control signal prevents operation of the sensor.

6. The apparatus according to claim 1, wherein the fuel gauge circuit further comprises an application processor responsive to the data processor and configured to calculate at least one of: a state of health of the battery, a state of function of the battery, and a state of charge of the battery based on the processed data.

7. The apparatus according to claim 1, wherein the memory is further configured to store:
   internal resistance values of the battery as a function of temperature and remaining capacity of the battery; and
   open circuit voltage values as a function of remaining capacity.

8. The apparatus according to claim 7, wherein the fuel gauge is further configured to:
   detect a temperature of the battery;
   determine a remaining capacity of the battery;

select an internal resistance value from the memory according to the remaining capacity and detected temperature;
compute a current of the power line using the selected internal resistance value and the measured voltage; and
compute a change in current based on the computed current and a previously-computed current.

9. A method for operating a battery system having a power line that connects a battery to a signal converter, wherein the signal converter generates data according to a sensor, comprising:
detecting noise on the power line comprising:
detecting a change in voltage on the power line;
detecting a change in current on the power line;
comparing the change in voltage to a first noise threshold and a second noise threshold; and
comparing the change in current to a third noise threshold and a fourth noise threshold;
reporting detected noise on the power line comprising:
generating a first notification signal if the change in voltage is greater than the first and second noise thresholds; and
generating a second notification signal if the change in current is greater than the third and fourth noise thresholds; and
controlling at least one of the sensor and the data in response to at least one of the first notification signal and second notification signal.

10. The method according to claim 9, further comprising measuring a temperature of the battery and determining an internal resistance of the battery based on the measured temperature.

11. The method according to claim 10, further comprising adjusting the first, second, third, and fourth noise threshold according to the determined internal resistance.

12. The method according to claim 9, wherein controlling the sensor comprises disabling operation of the sensor in response to at least one of the first notification signal and second notification signal.

13. The method according to claim 9, wherein controlling the data comprises preventing use of the data in response to at least one of the first notification signal and second notification signal.

14. A system, comprising:
a battery;
a power line connecting the battery to a signal converter, wherein the signal converter generates data according to a sensor; and
a fuel gauge circuit connected to the power line and configured to:
receive data from the signal converter;
measure a voltage of the power line;
compute a change in voltage based on the measured voltage;
compute a change in current of the power line based on the measured voltage;
determine a level of noise on the power line based on the computed change in current and the computed change in current voltage;
report detected noise on the power line; and
control at least one of the sensor and the data in response to the reported noise.

15. The system according to claim 14, wherein the processor determines the level of noise on the power line comprising:
comparing the change in voltage to a first noise threshold and a second noise threshold; and
comparing the change in current to a third noise threshold and a fourth noise threshold.

16. The system according to claim 15, wherein the processor reports noise on the power line comprising:
generating a first notification signal if the change in voltage is greater than the first and second noise thresholds; and
generating a second notification signal if the change in current is greater than the third and fourth noise thresholds.

17. The system according to claim 16, wherein:
controlling the sensor comprises disabling operation of the sensor in response to at least one of the first notification signal and second notification signal; and
controlling the data comprises preventing use of the data in response to at least one of the first notification signal and second notification signal.

18. The system according to claim 14, wherein the fuel gauge circuit further comprises a memory configured to store:
internal resistance values of the battery as a function of temperature and remaining capacity of the battery; and
open circuit voltage values as a function of remaining capacity.

19. The system according to claim 18, wherein the fuel gauge circuit is configured to:
detect a temperate of the battery;
determine a remaining capacity;
select an internal resistance value from the memory according to the remaining capacity;
compute a current of the power line using the selected internal resistance value, one open circuit voltage value, and the measured voltage; and
compute the change in current based on the computed current and a previously-computed current.

* * * * *